United States Patent
Duwel et al.

(10) Patent No.: US 7,005,946 B2
(45) Date of Patent: Feb. 28, 2006

(54) MEMS PIEZOELECTRIC LONGITUDINAL MODE RESONATOR

(75) Inventors: Amy E. Duwel, Cambridge, MA (US); David J. Carter, Maynard, MA (US); Mark J. Mescher, West Newton, MA (US); Mathew Varghese, Arlington, MA (US); Bernard M. Antkowiak, Sutton, MA (US); Marc S. Weinberg, Needham, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 10/631,695

(22) Filed: Jul. 31, 2003

(65) Prior Publication Data

US 2004/0027214 A1 Feb. 12, 2004

Related U.S. Application Data

(60) Provisional application No. 60/401,580, filed on Aug. 6, 2002.

(51) Int. Cl.
*H03H 9/00* (2006.01)
*H02N 2/00* (2006.01)
*H01L 41/04* (2006.01)
*H01L 41/08* (2006.01)
*H01L 41/18* (2006.01)

(52) U.S. Cl. ........................................ 333/187; 310/321
(58) Field of Classification Search ................ 333/133, 333/187, 188, 189, 186, 190, 191, 192, 197, 333/200; 310/320, 324, 352, 353, 321, 313 B, 310/367; 73/54.25
See application file for complete search history.

(56) References Cited

U.S. PATENT DOCUMENTS

| | | | |
|---|---|---|---|
| 3,634,787 A | | 1/1972 | Newell |
| 4,104,553 A | * | 8/1978 | Engdahl et al. ............. 310/352 |
| 4,139,793 A | * | 2/1979 | Michel ........................ 310/353 |
| 4,216,402 A | * | 8/1980 | Engdahl ...................... 310/320 |
| 4,306,204 A | * | 12/1981 | Johnson ....................... 333/189 |
| 4,556,812 A | * | 12/1985 | Kline et al. .................. 310/324 |
| 5,162,691 A | | 11/1992 | Mariani et al. |
| 5,548,179 A | * | 8/1996 | Kaida .......................... 310/367 |
| 5,587,620 A | | 12/1996 | Ruby et al. |
| 5,717,365 A | * | 2/1998 | Kaida et al. ................. 333/187 |
| 5,873,153 A | | 2/1999 | Ruby et al. |
| 6,049,702 A | | 4/2000 | Tham et al. |
| 6,060,818 A | | 5/2000 | Ruby et al. |
| 6,150,901 A | | 11/2000 | Auken |

(Continued)

FOREIGN PATENT DOCUMENTS

EP 0 096 653 A2 12/1983

(Continued)

OTHER PUBLICATIONS

Clark et al., "Parallel-Resonator HF Micromechanical Bandpass Filters," *Transducers*, 1997, pp. 1161-1164, Jun. 16-19.

(Continued)

*Primary Examiner*—Patrick Wamsley
(74) *Attorney, Agent, or Firm*—Goodwin Procter LLP

(57) ABSTRACT

A longitudinal mode resonator that includes a substrate and a bar that is suspended relative to the substrate. The bar is suspended such that it is free to expand and contract longitudinally in response to the application of an electric field across its thickness. The expansion and contraction of the bar achieves resonance in response to the field having a frequency substantially equal to the fundamental frequency of the bar.

30 Claims, 7 Drawing Sheets

U.S. PATENT DOCUMENTS

| | | | |
|---|---|---|---|
| 6,238,946 B1 | 5/2001 | Ziegler | |
| 6,275,122 B1 | 8/2001 | Speidell et al. | |
| 6,347,237 B1 | 2/2002 | Eden et al. | |
| 6,391,674 B1 | 5/2002 | Ziegler | |
| 6,424,074 B1 | 7/2002 | Nguyen | |
| 6,424,237 B1 * | 7/2002 | Ruby et al. | 333/187 |
| 6,429,755 B1 | 8/2002 | Speidell et al. | |
| 6,437,478 B1 * | 8/2002 | Yamamo To | 310/313 B |
| 6,448,622 B1 | 9/2002 | Franke et al. | |
| 6,516,208 B1 | 2/2003 | Eden | |
| 6,566,786 B1 | 5/2003 | Nguyen | |
| 6,577,040 B1 | 6/2003 | Nguyen | |
| 6,774,746 B1 * | 8/2004 | Whatmore et al. | 333/189 |
| 6,820,469 B1 * | 11/2004 | Adkins et al. | 73/54.25 |
| 6,867,667 B1 * | 3/2005 | Takeuchi et al. | 333/189 |
| 6,894,586 B1 | 5/2005 | Bircumshaw et al. | |
| 2001/0016367 A1 | 8/2001 | Ziegler | |
| 2001/0030489 A1 | 10/2001 | Nguyen | |
| 2001/0031025 A1 | 10/2001 | Nguyen | |
| 2001/0033119 A1 | 10/2001 | Nguyen | |
| 2001/0033121 A1 | 10/2001 | Nguyen | |
| 2002/0021054 A1 | 2/2002 | Nguyen | |
| 2002/0041220 A1 | 4/2002 | Nguyen | |
| 2002/0180563 A1 | 12/2002 | Ma et al. | |
| 2002/0190603 A1 | 12/2002 | Ma et al. | |
| 2003/0048520 A1 | 3/2003 | Ma et al. | |
| 2003/0062961 A1 | 4/2003 | Ma et al. | |
| 2003/0125214 A1 | 7/2003 | Eden et al. | |
| 2004/0113722 A1 | 6/2004 | Bircumshaw et al. | |

FOREIGN PATENT DOCUMENTS

| | | | |
|---|---|---|---|
| EP | 319475 | * | 6/1989 |
| JP | 59-37722 | | 3/1984 |
| JP | 59037722 | | 3/1984 |
| WO | 02/081365 A2 | | 10/2002 |

OTHER PUBLICATIONS

Cleland et al., "Fabrication of high frequency nanometer scale mechanical resonators from bulk Si crystals," *Appl. Phys. Lett.*, vol. 69, No. 18, Oct. 28, 1996, pp. 2653-2655.

Craninckx et al, "A 1.8-GHz Low-Phase-Noise CMOS VCO Using Optimized Hollow Spiral Inductors," *IEEE Journal of Solid-State Circuits*, vol. 32, No. 5, May 1997, pp. 736-744.

Driscoll et al., "Extremely Low Phase Noise UHF Oscillators Utilizing High-Overtone, Bulk-Acoustic Resonators," *IEEE Transactions on Ultrasonics, Ferroelectrics, and Frequency Control*, vol. 39, No. 6, Nov. 1992, pp. 774-779, no date (Nov. 1972).

Dubois et al., "BAW resonators based on aluminum nitride thin films," *IEEE Ultrasonics Symposium*, 1999, pp. 907-910, no month.

Grudkowski et al., "Fundamental-mode VHF/UHF minature acoustic resonators and filters on silicon," *Appl. Phys. Lett.*, vol. 37, No. 11, Dec. 1, 1980, pp. 993-995.

Gualtieri et al., "Advances in High-Q Piezoelectric Materials and Devices.", Missing All Time Data.

Kline et al., "Overmoded High Q Resonators for Microwave Oscillators," *IEEE International Frequency Control Symposium*, 1993, pp. 718-721, no month.

Krishnaswamy et al., "Film Bulk Acoustic Wave Resonator Technology," *Ultrasonics Symposium*, 1990, pp. 529-536, no month.

Lakin et al., "High-Q Microwave Acoustic Resonators and Filters," *IEEE Transactions on Microwave Theory and Techniques*, vol. 41, No. 12, Dec. 1993, pp. 2139-2146, no date.

Lakin, "Thin Film Resonators and Filters," Presented at the 1999 IEEE International Ultrasonics Symposium, Oct. 17-21, 1999, paper M-1.

Larson et al., "A BAW Antenna Duplexer for the 1900 MHz PCS Band," *IEEE Ultrasonics Symposium*, 1999, pp. 887-890, no month.

Lutsky et al., "A Sealed Cavity TFR Process for RF Bandpass Filters," *IEDM*, 1996, pp. 4.4.1-4.4.4, no month.

Stokes et al., "X-Band Thin Film Acoustic Filters GaAs," *IEEE Transactions on Microwave Theory and Techniques*, vol. 41, No. 6/7, Jun./Jul. 1993, pp. 1075-1080, no date.

Tsubouchi et al., "Zero-Temperature-Coefficient SAW Devices on AIN Epitaxial Films," *IEEE Transactions on Sonics and Ultrasonics*, vol. SU-32, No. 5, Sep. 1985, pp. 634-644, no date.

Wang et al., "Low-temperature coefficient bulk acoustic wave composite resonators," *Appl. Phys. Lett.*, vol. 40, No. 4, Feb. 15, 1982, pp. 308-310.

Wang et al., "VHG Free-Free Beam High-Q Micromechanical Resonators," *Journal of Microelectromechanical Systems*, vol. 9, No. 3, Sep. 2000, pp. 347-360, no date.

Wang et al., "VHF Free-Free Beam High-Q Micromechanical Resonators," *Technical Digest*, 12th International IEEE Micro Electro Mechanical Systems Conference, Orlando, Florida, Jan. 17-21, 1999, pp. 453-458.

Wang et al., "High-Order Medium Frequency Micromechanical Electronic Filters," *Journal of Microelectromechanical Systems*, vol. 8, No. 4, Dec. 1999, pp. 534-557, no date.

Yao, "RF MEMS from a device perspective," *J. Micromech. Microeng.*, vol. 10, 2000, pp. R9-R38, no month.

Ziaie et al., "A generic micromachined silicon platform for high-performance RF passive components," *J. Micromech. Microeng.*, vol. 10, 2000, pp. 365-371, no month.

Copy of International Search Report, PCT/US 03/23982, Mailing Date Oct. 7, 2004.

L. Sekaric et al., "Nanomechanical Resonant Structures in Silicon Nitride: Fabrication, Operation and Dissipation Issues," Sensors and Actuators vol. 101 215-219 (2002), no month.

* cited by examiner

MEMS PIEZOELECTRIC LONGITUDINAL MODE RESONATOR

CROSS-REFERENCE TO RELATED APPLICATION

This application claims priority to and the benefit of, and incorporates herein by reference, in its entirety, provisional U.S. patent application Ser. No. 60/401,580, filed Aug. 6, 2002.

STATEMENT REGARDING FEDERALLY SPONSORED RESEARCH OR DEVELOPMENT

The U.S. Government has certain rights in this invention as provided for by the terms of Contract No. DAAH01-01-C-R204 awarded by the United States Army.

TECHNICAL FIELD

The invention relates generally to the field of micro-electro-mechanical systems (MEMS). In particular, the invention relates to piezoelectric MEMS resonators.

BACKGROUND OF THE INVENTION

Resonators are traditionally employed as components, in among other things, filters and oscillators. Resonators have gained greater importance lately with the growth of the mobile communications technology and the increasing clock speed of computers. Mobile devices require small precision filters, and computer clocks require oscillators capable of error-free high frequency oscillation. Typical resonator applications require resonators to demonstrate Q values higher than one thousand at an impedance load of approximately 50Ω, be compatible with common voltage ranges of typical integrated circuits, and to resonate at frequencies near or above 1 GHz.

Conventional resonators include, for example, surface acoustic wave (SAW) resonators, fundamental mode thin film resonators (TFRs), flexural mode MEMS beam resonators, guided electromagnetic wave structures, lumped element inductors and capacitors, thin film bulk acoustic resonators (TFBARs), overmoded bulk crystals, and solidly mounted resonators (SMRs). These filters suffer from a variety of shortcomings, for example many are too large for placement onto an integrated circuit, operate in an unsatisfactorily small frequency range, require too high a voltage for operation, and/or cannot achieve a sufficiently high Quality (Q) level with a 50Ω load. Q is a measure of the energy efficiency of a filter and also is a measure of the sharpness of the filter's frequency response, i.e., a high Q filter passes a narrower band of frequencies than a lower Q filter.

Many traditional resonators are too large to incorporate one or more resonators onto an integrated circuit. For example, thin-film resonators (TFRs) commonly have a footprint on the order of hundreds of microns. Surface acoustic wave (SAW) resonators are typically even larger, in some cases requiring substrates as large several centimeters or inches to exhibit desirable performance characteristics.

Several traditional resonators operate in an undesirably limited frequency range. MEMS flexural mode beam resonators typically do not operate satisfactorily in the Ultra-High Frequency range. Similarly, TFBARs and SMRs are difficult to make with center frequencies much below 1 GHz since film stress becomes an issue as the film thickness is increased. Furthermore, with most film based resonators, multiple resonators with differing frequencies cannot be placed on a single integrated circuit because the film thickness is typically uniform across a substrate.

Many MEMS flexural mode beam resonators also suffer from requiring activation voltages that make the resonators difficult to integrate in standard integrated circuits. MEMS flexural mode beam resonators are commonly actuated capacitively, in some cases requiring as much a 50V to achieve resonance.

Many conventional resonators do not exhibit high enough Q levels with a 50Ω load. Typical lumped element inductors, SMRs, and many TFBARs fail to meet the desired Q level of 1000 in response to operating with a 50Ω load. MEMS flexural mode beam resonators can operate with higher Q levels, but usually require operation in a vacuum to do so.

SUMMARY OF THE INVENTION

The invention overcomes the above discussed shortcomings in conventional resonators, by in one embodiment, providing a micron scale MEMS longitudinal mode resonator that can be readily incorporated into an integrated circuit. According to another advantage, the invention provides resonators that are small enough to incorporate into large resonator arrays, which in turn may be incorporated onto a single substrate. Embodiments of the invention can thus be used to construct bandpass filters around multiple frequencies, and specifically Rx/Tx filters onto a single integrated circuit substrate. In addition, resonators designed in accordance with the invention can operate across a large frequency range, from at least as low as about 150 MHz up to at least around 1.6 GHz. Embodiments of the invention can also be easily integrated into many common integrated circuit designs because embodiments exhibit limited temperature sensitivity and Q levels of over 1000 while operating with an impedance compatible with a 50Ω circuit.

In one aspect, the invention provides a longitudinal mode resonator that includes a substrate and a bar (constructed of a piezoelectric material such as Aluminum Nitride in some embodiments) that is suspended relative to the substrate. For example, in one configuration, two flexural supports suspend the bar over a cavity defined in the substrate. In another configuration, the flexural supports suspend the bar over a substantially flat substrate via insulating mounting pads. In an alternative configuration, a support located substantially beneath the center of the bar supports the bar relative to the substrate. In one such configuration, the support suspends the bar into a cavity defined in a second substrate.

Preferably, regardless of the suspension approach, the bar is suspended such that it is free to expand and contract longitudinally in response to the application of an electric field across its thickness. The expansion and contraction of the bar achieves resonance in response to the field having a frequency substantially equal to the fundamental frequency of the bar. The fundamental frequency of the bar is a function of the bar's length, providing the advantage that a manufacturer can change the frequency of a resonator built according to an embodiment of the invention, post-production, by laser trimming the resonator's bar.

In one embodiment, an input electrode and an output electrode are disposed on first and second surfaces of the bar of the resonator. In the single support configuration described above, the output electrode is disposed in the bottom of the cavity of the second substrate. In some configurations, the longitudinal mode resonator also includes an electrical signal input in electrical communication with the input electrode for providing an electrical signal input to the input electrode.

A further aspect of the invention relates to a method of fabricating a MEMS piezoelectric resonator. The fabrication method includes forming a stack of layers of materials, including at least one piezoelectric material layer, on a substrate. In one embodiment the stack includes a first metal electrode layer, a piezoelectric material layer, and second metal electrode layer. In another embodiment, the stack also includes an insulating layer.

The frequency of the resonator is then set by applying a pattern mask to the top of the stack. A plurality of the layers of the stack are then etched using one or more etching chemicals or techniques. Illustrative etching techniques include reactive ion etching and wet etching. Depending on the materials selected for the stack, one etching chemical or technique may etch more than one layer at a time, reducing the number of etches needed to produce the resonator. In some embodiments, further etching steps can be used to create additional features in individual layers. Such features include current stops and insulating pads. By stacking the layers and etching the common features of the stack first, some additional features can be defined without the need for later realignment.

In another aspect of the invention, embodiments of the longitudinal mode resonators described above are combined into a multi-frequency filter. The multi-frequency filter includes a substrate, an input terminal for receiving an alternating signal, and a first and second resonator. The first resonator includes a first bar having a first length that is suspended relative to the substrate such that the first bar is free to expand and contract longitudinally in response to the application of an electrical field across the first bar's thickness. The first bar achieves resonance in response to the application of an electric field having a frequency that substantially matches the fundamental frequency of the first bar. The multi-frequency filter's second resonator includes a second bar having a second length that is suspended relative to the substrate such that the second bar is free to expand and contract longitudinally in response to the application of an electrical field across the second bar's thickness. The second bar achieves resonance in response to the application of an electric field having a frequency that substantially matches the fundamental frequency of the second bar.

The multi-frequency filter also includes a multiplexer that is in electrical communication with the input terminal, the first resonator, and the second resonator. The multiplexer communicates the alternating signal to at least one of the first resonator and the second resonator. An output terminal is provided that is in communication with the first resonator and the second resonator to receive the filtered alternating signal. In other embodiments, the multi-frequency filter includes a number of additional resonators (up to as many as desired on a single chip) that also are communication with the multiplexer.

In another aspect of the invention, embodiments of the longitudinal mode resonators described above are combined into a multi-frequency oscillator. The multi-frequency oscillator includes a substrate, a nonlinear feedback element, such as an amplifier, for providing a signal, and a first and second resonator. The first resonator includes a first bar having a first length that is suspended relative to the substrate such that the first bar is free to expand and contract longitudinally in response to the application of an electrical field across the first bar's thickness. The first bar achieves resonance in response to the application of an electric field having a frequency that substantially matches the fundamental frequency of the first bar. The multi-frequency oscillator's second resonator includes a second bar having a second length that is suspended relative to the substrate such that the second bar is free to expand and contract longitudinally in response to the application of an electrical field across the second bar's thickness. The second bar achieves resonance in response to the application of an electric field having a frequency that substantially matches the fundamental frequency of the second bar.

The multi-frequency oscillator also includes a multiplexer that is in electrical communication with the input terminal, the first resonator, and the second resonator. The multiplexer communicates the signal to at least one of the first resonator and the second resonator. An output terminal is provided that is in communication with the first resonator and the second resonator to receive the oscillated signal. In other embodiments, the multi-frequency oscillator includes a number of additional resonators (up to as many as desired for a single integrated circuit) that also are in communication with the multiplexer and output terminal.

Other aspects and advantages of the invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the invention, as well as the invention itself, will be more fully understood from the following description and accompanying drawings. In the drawings, like reference characters generally refer to the same parts through the different views. The drawings are not necessarily to scale but rather illustrate the principles of the invention.

ILLUSTRATIVE DESCRIPTION

Figure 1:
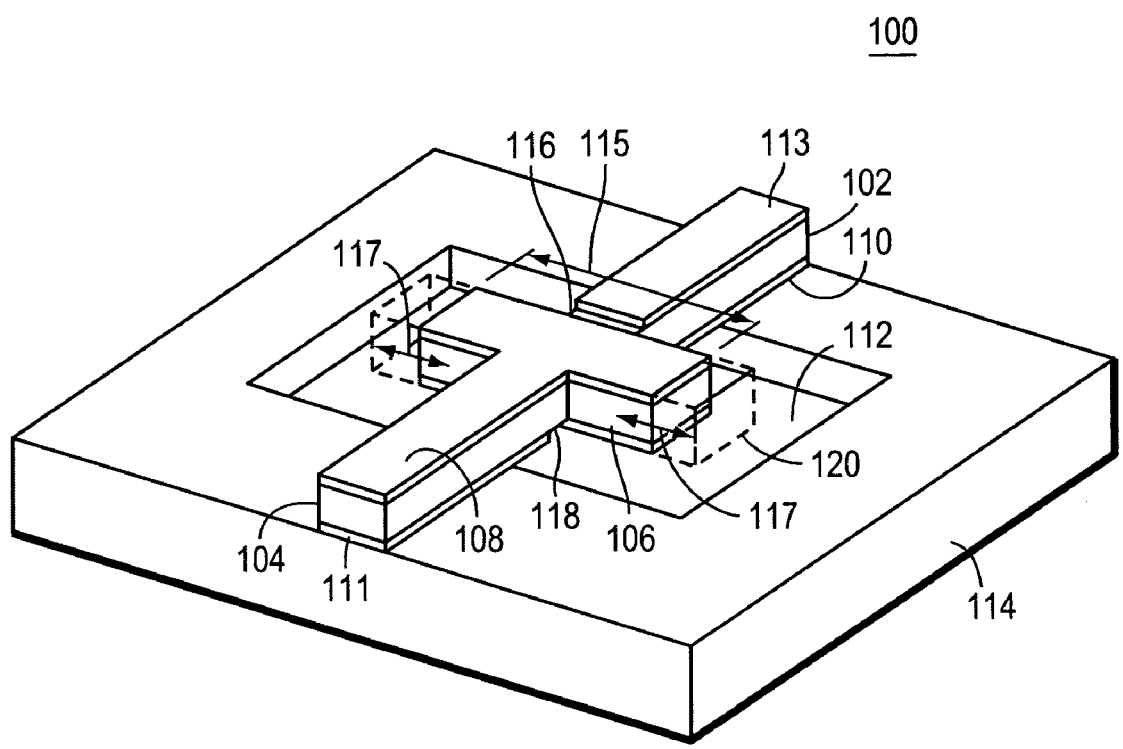
FIG. 1 is a conceptual drawing, in perspective, of a longitudinal mode resonator according to an illustrative embodiment of the invention.

As shown in the drawings for the purposes of illustration, the invention may be embodied, for example, as a MEMS longitudinal mode resonator, a multi-frequency oscillator circuit utilizing more than one MEMS longitudinal mode resonator, and/or a multi-frequency filter utilizing more than one MEMS longitudinal mode resonator.

FIG. 1 is a conceptual view, in perspective, of a MEMS longitudinal mode resonator 100 according to an illustrative embodiment of the invention. The resonator 100 includes two approximately equal length flexural supports 102 and 104, a bar 106, and two electrodes 108 and 110. The flexural supports 102 and 104 suspend the bar 106 over a cavity 112 in a substrate 114.

In the illustrative embodiment, the flexural supports 102 and 104 and the bar 106 are about 0.5 μm thick and formed from a single piezoelectric material, such as aluminum nitride. Piezoelectric materials deform in the presence of a voltage and similarly produce a voltage across the material if the material is deformed. The characteristic arises from an uneven distribution of charge within the material. The resonator 100 capitalizes upon this characteristic of piezoelectric materials to excite the bar 106 into resonance.

More particularly, the electrode 108 is an input electrode. The other electrode 110 is an output electrode. According to the illustrative embodiment, the input electrode 108 is made of nickel and the output electrode 110 is made of molybdenum. The choice of which electrode is used for input and which electrode is used for output is preferably interchangeable, depending on the layout of the remainder of the circuit into which the resonator is integrated. The metals used for the electrodes 108 and 110 differ for fabrication purposes such that the electrodes 108 and 110 can be selectively etched using different etching chemicals. In other fabrication processes, the electrodes 108 and 110 are constructed of the same metal.

In operation, an alternating electrical signal is applied to the input electrode 108. The alternating electrical signal generates an electrical field between the input electrode 108 and the output electrode 110 through the bar 106. The electrodes 108 and 110 may appear to cover either side of the entire resonator 100, however, current stops 116 and 118 are preferably etched through the input electrode 108 and through the output electrode 110, respectively, such that electrode material in electrical communication with other parts of the device is only located on one side of each flexure 104 and 106. As a result, predominately only along the bar 106 is there electrode material on opposing sides of the resonator 100 that is in communication with other parts of the device. The remaining electrode materials 111 and 113 are an artifact of the fabrication process (see below for more detail on one illustrative fabrication process).

As a result of the bar 106 being constructed of a piezoelectric material, in response to the electrical field being across the bar 106, the bar 106 either expands or contracts depending upon the field. While the bar expands and contracts to varying degrees across its entirety in all directions, the bar expands and contracts predominately at its ends in a longitudinal direction 117 (i.e. in a longitudinal mode) as a result of the shape of the bar and the symmetrical application of the field across its thickness. The expansion and contraction is accompanied by a rearrangement of the charge distribution within the bar 106 resulting in an output current flowing through the output electrode, 110. In response to the frequency of the electrical signal substantially matching the fundamental frequency ($f_0$) of the bar 106, the bar 106 achieves resonance in its longitudinal mode, and the output current generated by the expansion and contraction has a frequency closely resembling the frequency of the electrical field. Illustratively, resonance can also be achieved at higher harmonics. The induced piezoelectric current acts to pass the electrical signal through the device, whereas non-resonance inducing signals are damped out by irregularly induced piezoelectric current. In some illustrative embodiments, the device exhibits similar response characteristics to a simple Resistor, Inductor, Capacitor (RLC) circuit.

The fundamental frequency ($f_0$) of the bar 106 is dictated by the length (L) 115 of the bar $$f_0 \cong \frac{1}{2L}(\text{modulus/density})^{\frac{1}{2}}$$

The modulus and density are constants associated with the material from which the bar 106 is constructed. As a result, resonators with different frequencies can be designed by changing the length L 115 of the bar. For example, a 6 μm long bar has a center frequency of approximately 780 MHz and a 5 μm long bar has a center frequency of about 1 GHz.

Devices built according to the invention also exhibit sufficiently high Q values for use in many common resonator applications. As mentioned above, Q reflects the level of energy lost by the device in relation to the energy input and the sharpness of the device's frequency response. Q levels greater than 1,000 are generally desired for many applications. The use of mechanical resonance, longitudinal resonance, and piezoelectric materials reduces thermo-elastic energy loss, yielding Q values in excess of 10,000.

The resonator 100 is attached to a substrate 114, typically made of a semiconductor, such as Silicon, Silicon Germanium, or Gallium Arsenide. The selection of the substrate material is based partially on the fabrication process so that the material of the substrate 114 responds appropriately to the various etches employed. The substrate 114 defines a cavity 112 in its surface over which the flexural supports 102 and 104 suspend the bar 106. The dimensions of the cavity 112 preferably exceed that of the bar 106 at its peak expansion 120. The cavity 112 enables the bar 106 to expand and contract without causing any friction with the substrate 114.

Figure 2:
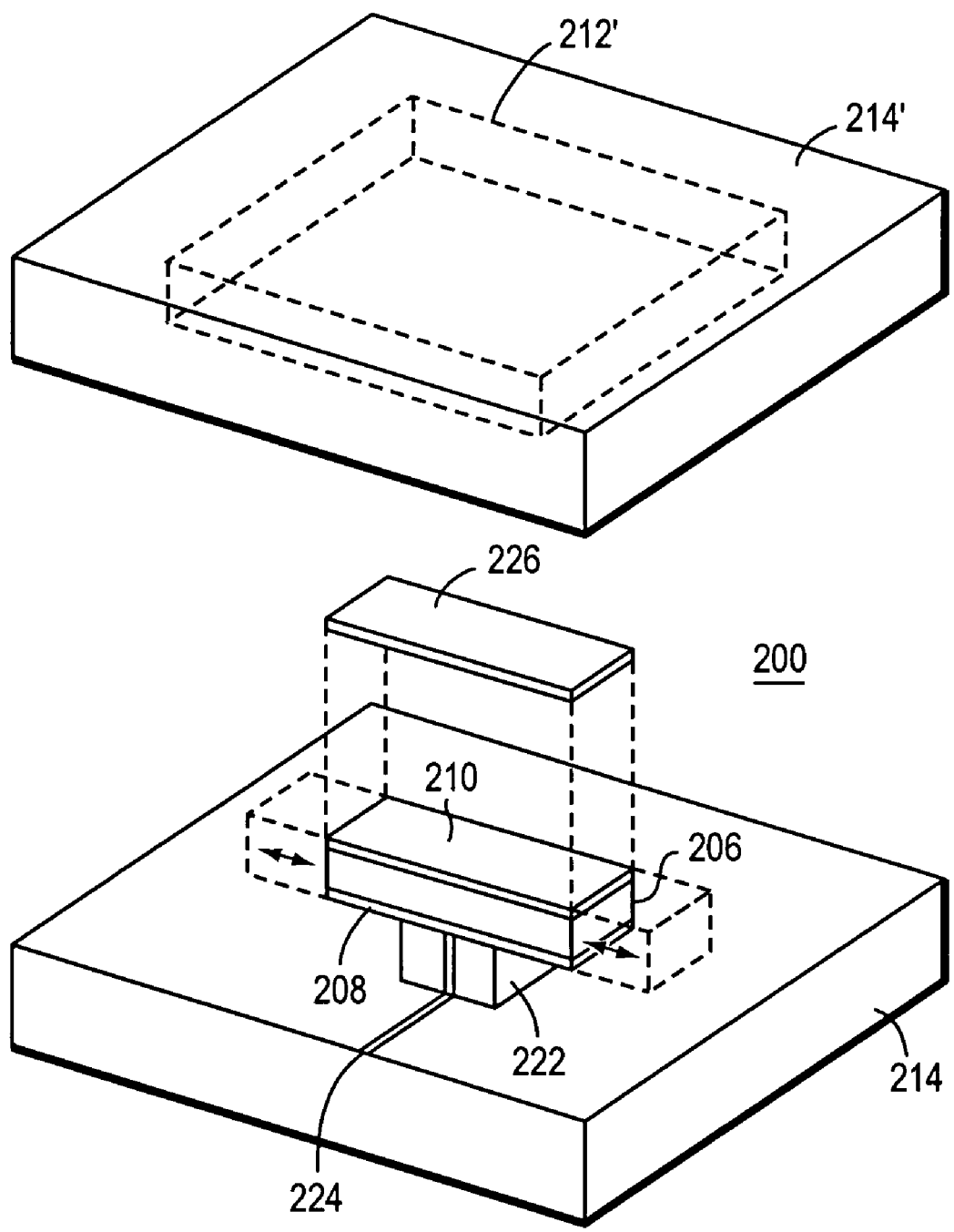
FIG. 2 is a conceptual drawing, in perspective, of a longitudinal mode resonator according to another illustrative embodiment of the invention.

FIG. 2 is a conceptual view, in perspective, of a MEMS longitudinal mode resonator 200 according to another illustrative embodiment of the invention. The input electrode 208 and the output electrode 210 sandwich the bar 206. A support 222 from the substrate 214 supports the bar 206 and the electrodes 208 and 210 relative to the substrate 214. The input electrode 208 receives an electrical signal from a signal input lead 224 electrically linking the resonator 200 with the remainder of the integrated circuit (not shown). To keep the electrodes 208 and 210 electrically isolated, any output signal from the output electrode 210 is measured capacitively through a capacitor plate 226 suspended relative to the output electrode 210.

In one embodiment, the capacitive plate 226 is disposed at the bottom of a cavity 212' in a second substrate 214'. The resonator 200 is then inverted and suspended in the cavity 212' from the support 222.

Figure 3:
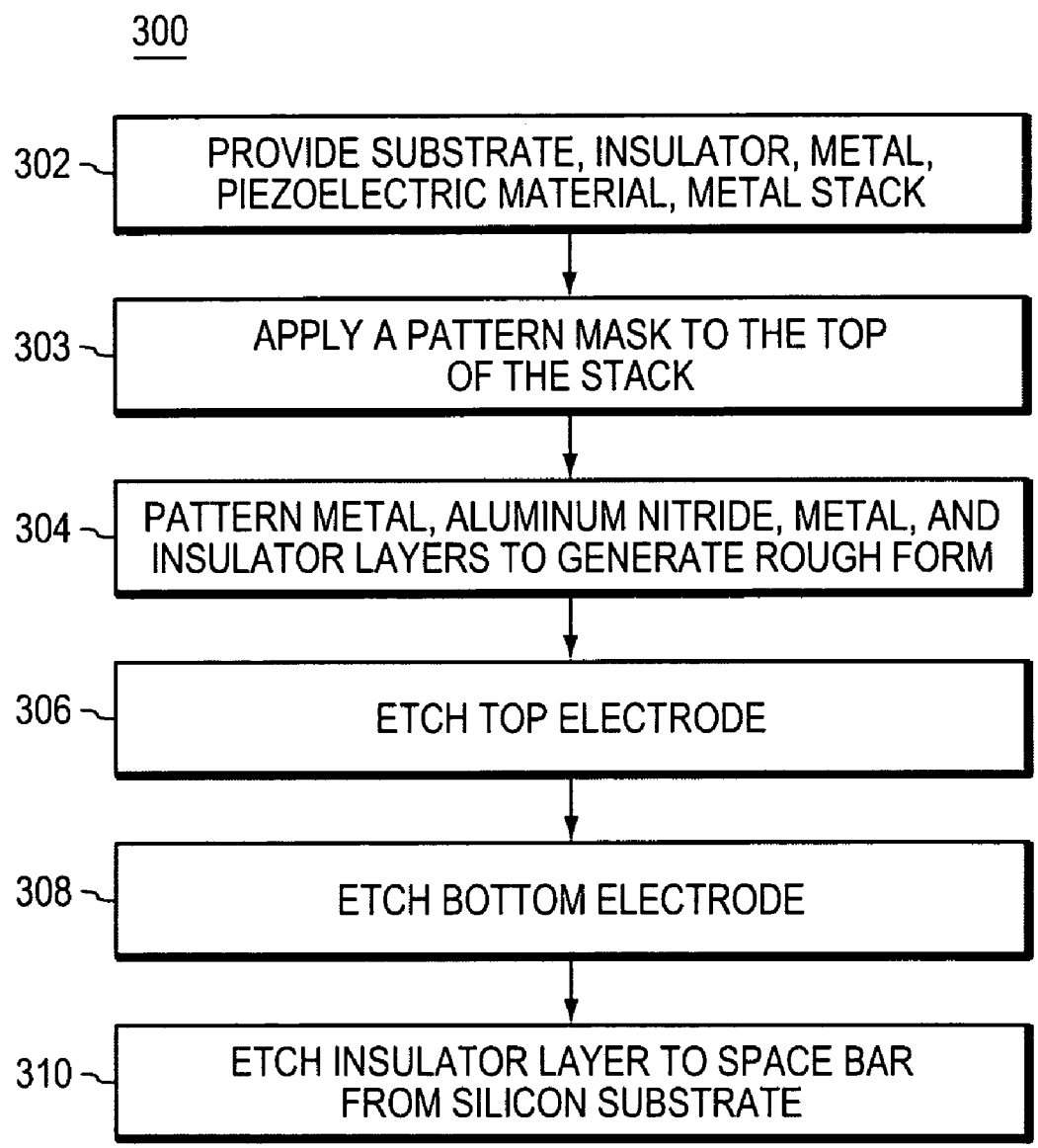
FIG. 3 is a flow chart depicting a process for fabrication of an illustrative longitudinal mode resonator according to an illustrative embodiment of the invention.

FIG. 3 is a flow chart depicting an illustrative fabrication process 300 for fabricating a MEMS longitudinal mode resonator according to an illustrative embodiment of the invention. FIGS. 4A–4E are a series of conceptual drawings illustrating the process of FIG. 3. Referring to FIGS. 3 and 4A–4E, the resonator 400 differs from the resonator 100 of FIG. 1 in the way in which the bars 406 and 106 are suspended. In FIG. 1, the bar 106 is suspended relative to a cavity 112 in a substrate 114. In FIG. 4E, the insulating pads 426 and 428 separate the bar 406 and the supports 402 and 404 from a substrate 414, which is substantially flat relative to the resonator 400. The process 300 can best be understood by viewing FIG. 3 and FIGS. 4A–4E together.

The first step 302 is to form a stack 430 (see FIG. 4A) on a substrate layer 432 that includes an insulating layer 434, a first metal electrode layer 436, a layer of piezoelectric material 438, and a second metal electrode layer 440.

Illustrative metal layers include molybdenum, nickel, titanium, aluminum, and combinations of metals. In the illustrative embodiment, the substrate layer 432 is Si. In other illustrative embodiments, the substrate layer 432 is, for example, SiGe, GaAs, or $SiO_2$. In one embodiment the insulating material of the insulating layer 434 is an oxide. The insulating layer 434 is attached to the substrate layer 432. The first metal electrode layer 436 is then deposited upon the insulating layer 434. The layer of piezoelectric material 438, typically Aluminum Nitride, is then grown on the first metal electrode layer 436. A second metal electrode layer 440 is then deposited on top of the piezoelectric material layer 438. In the illustrative embodiment, the first metal electrode layer 436 is made of molybdenum and the second metal electrode layer 440 is made of nickel. In other embodiments of the invention, the metal used in the first metal electrode layer 436 and the second metal electrode layer 440 is the same metal.

Figure 4A:
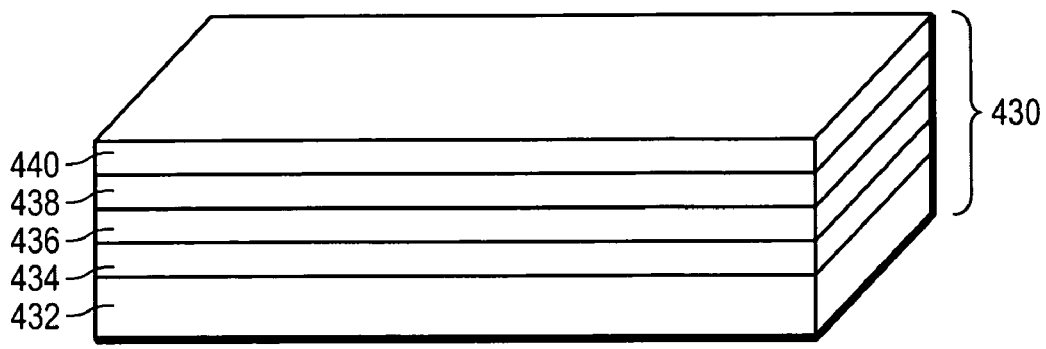
FIGS. 4A–4E are conceptual drawings, in perspective of the stages of the fabrication process depicted in FIG. 3.
Figure 4B:
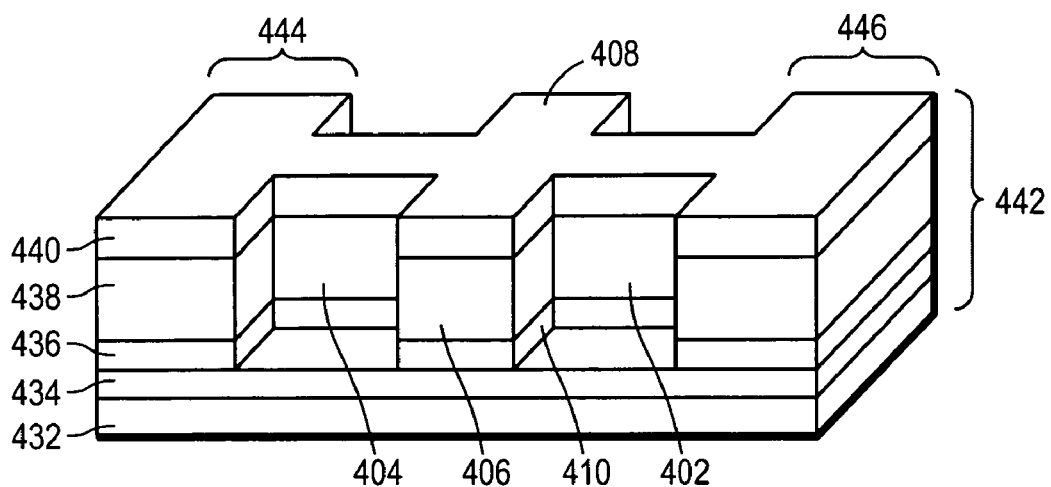

Next, a pattern mask is applied to the top of the stack 430 (step 303), and the metal electrode layers 436 and 440 and the piezoelectric material layer 438 are patterned using a series of etches to create the rough form 442 of the resonator 400 (step 304) (see FIG. 4B). The lateral dimensions of the pattern mask set the resonant frequency of the resonator. Illustratively, a wet chemical etch is used to shape the second electrode layer 440, a chlorine-based dry reactive ion etch (RIE) is used to shape the piezoelectric layer 438, and a fluorine-based RIE is used to shape the first metal electrode layer 436 and the insulating layer 434. In the rough form 442, the bar 406, the flexural supports 402 and 404, and the unprocessed electrodes 408 and 410 are recognizable. The two structures on either end of the flexural supports 402 and 404 are mounting pads 444 and 446. In other fabrication processes involving different electrode metals, the rough form 442 is shaped using a single chlorine-based RIE etch. In either fabrication process, a pattern mask (preferably a single pattern mask) is used to generate the rough form 442.

Figure 4C:
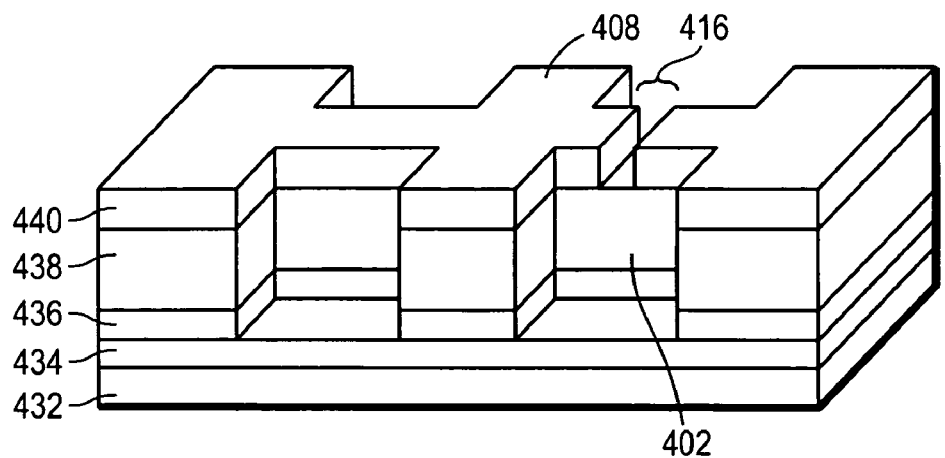

In step 306, the second metal electrode layer 440 is chemically etched to create a first current stop 416 (see FIG. 4C). Illustratively, a window approximately the size of the current stop 416 and slightly wider than the flexural support is opened in photoresist. Chemical etching is then used to etch the first current stop 416. The chemical used in the etching is selected such that it affects the second metal electrode layer 440 and not the first metal electrode layer 436 or the piezoelectric layer 402. Other illustrative options, such as for when the first metal electrode layer 436 and the second metal electrode layer 440 are the same metal, include opening a similar sized window in the pattern mask and applying a wet etch for a timed duration.

Figure 4D:
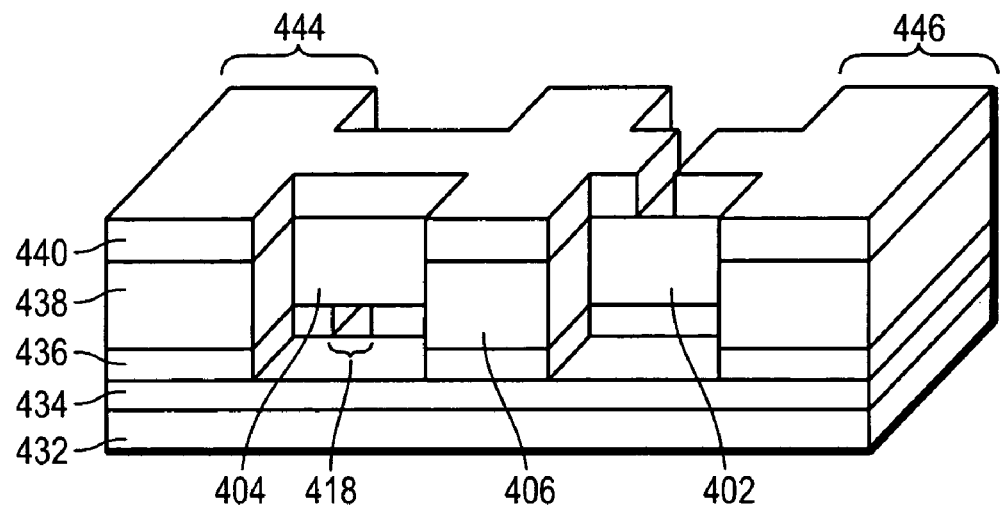
Figure 4E:
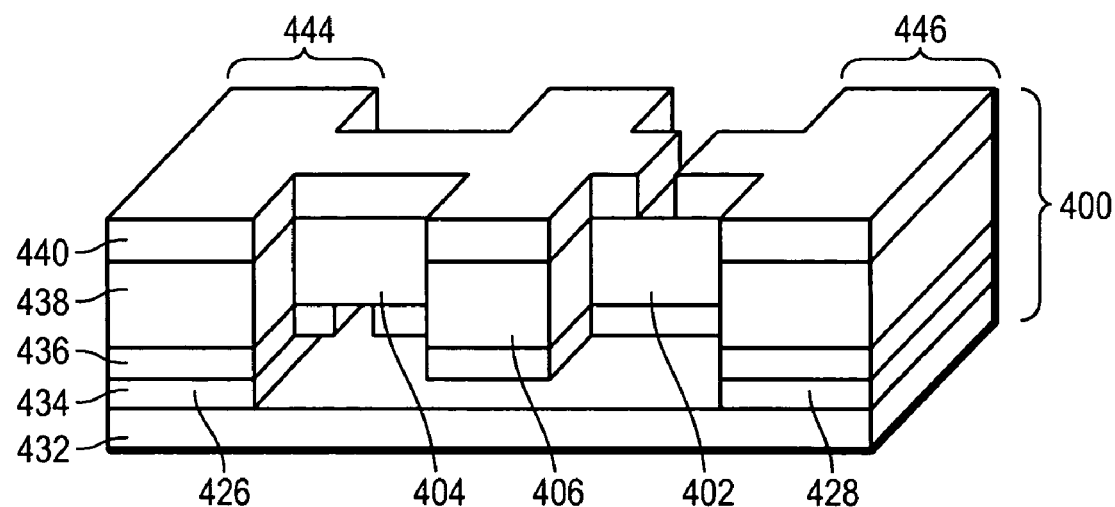

In step 308, the first metal electrode layer 436 is chemically etched to create the second current stop 418 (see FIG. 4D). As with the etching of step 306, preferably photoresist is applied and patterned, and a second chemical is selected to selectively etch the first metal electrode layer 436 (from the exposed edges in) but not the second the metal electrode layer 440 or the piezoelectric layer. In the case where the first metal electrode layer 436 and the second metal electrode layer 440 are made of the same material, a voltage may be applied to the second metal electrode layer 440 such that the second metal electrode layer 440 is electrochemically protected from etching. Similarly, one could use an etchant that only etches metal in the presence of a voltage and apply such a voltage to the first metal electrode layer 436. Alternatively, one could etch both metal electrode layers 436 and 440 and then "patch" the top metal using a patch technique.

In step 310, the insulating layer 434 is etched away such that the insulating material beneath the bar 406 and the flexural supports 402 and 404 is removed, and insulating material remains beneath the mounting pads 444 and 446 to form the insulating pads 426 and 428 (see FIG. 4E). In this sample embodiment, the mounting pads are wider than the bar 406 and the flexural supports 402 and 404. Therefore, by applying a wet etch that etches away the insulating material from the outside in, the etching time can be readily limited to meet this constraint. After the insulating material is etched away (step 310), the bar 406 is free to oscillate, being suspended away from the substrate layer 432 by the insulating pads 426 and 428 that remain between the bases of the mounting pads 444 and 446 and the substrate layer 432.

Sample resonators built using the fabrication process 300 have bars 406 ranging from about 3 microns to about 10 microns in length, yielding fundamental frequencies ranging from about 500 MHz to about 1.6 GHz. The flexural supports 402 and 404 range in length from about 5 microns to about 29 microns and have widths ranging from about 1 micron to about 3 microns.

Figure 5:
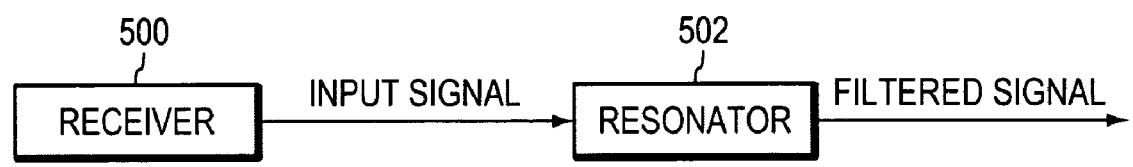
FIG. 5 is a block diagram of a filter incorporating a resonator according to an illustrative embodiment of the invention.

FIG. 5 is a block diagram depicting a sample application of a longitudinal mode resonator built according to the invention. In FIG. 5, a receiver 500 outputs an electrical signal to the longitudinal mode resonator 502. The resonator 502 passes through components of the electrical signal having a frequency surrounding the fundamental frequency of the resonator 502 thereby acting as a bandpass filter.

Figure 6:
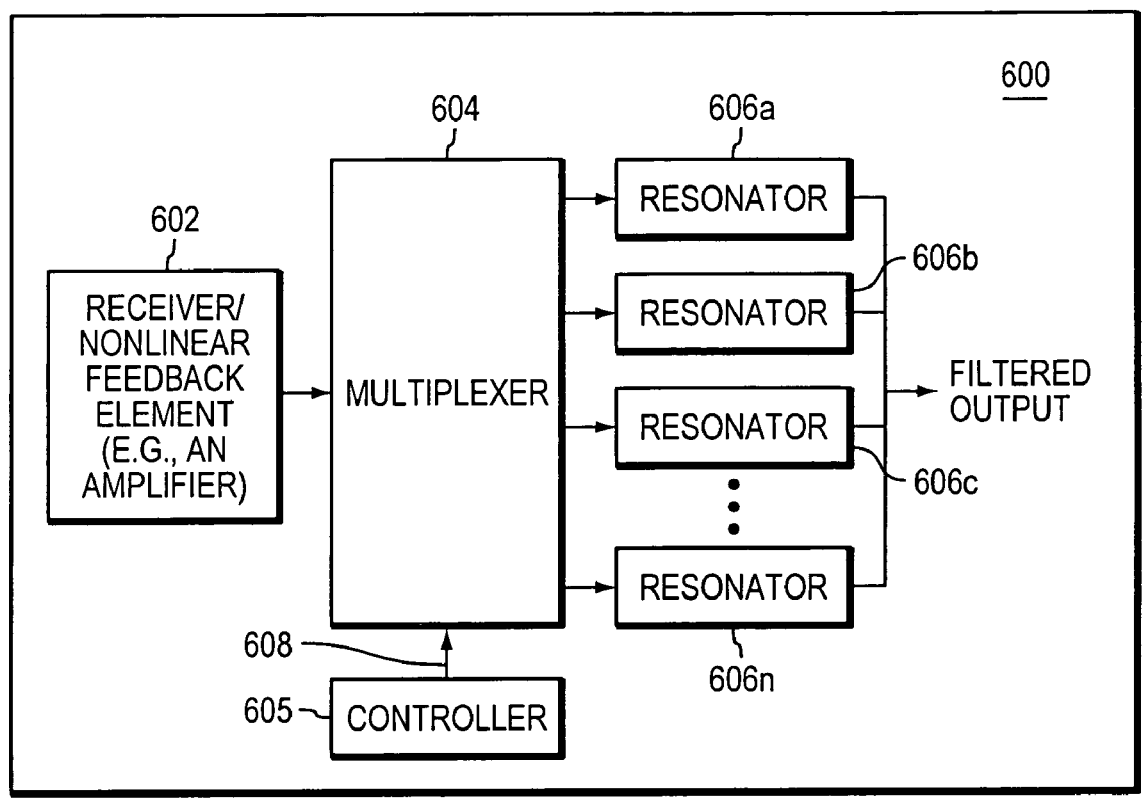
FIG. 6 is a block diagram of a multi-frequency filter according to an illustrative embodiment of the invention.

FIG. 6 is a block diagram depicting a multi-frequency resonator array according to an illustrative embodiment of the invention. The multi-frequency resonator array 600 includes a receiver, 602, a multiplexer 604, a controller 605, and a plurality of MEMS longitudinal mode resonators 606a–606n, each in electrical communication with the multiplexer 604 and each having bars 106, 206 or 406 (depending on the embodiment of the resonator used) of different lengths.

The receiver 602, in one illustrative embodiment, includes an antenna. The receiver 602 passes the input signal to the multiplexer 604. The multiplexer 604, in response to the control signals 608 from the controller 605, directs the input signal to one or more of the resonators 606a–606n to selectively filter the input signal. The small size of the MEMS longitudinal mode resonators 606a–606n enables one to build a single integrated circuit incorporating multiple filter elements.

A similar integrated circuit can be used to design a multi-frequency oscillator according to another illustrative embodiment of the invention. The oscillator is created by substituting a nonlinear feedback element, such as an amplifier, in place of the receiver 602. A user can then, by switching the multiplexer via the control 608, direct the electrical signal from the nonlinear feedback element to different resonators 606a–606n, to create an output signal having different frequencies.

One skilled in the art will realize the invention may be embodied in other specific forms without departing from the spirit or essential characteristics thereof. The foregoing embodiments are therefore to be considered in all respects illustrative rather than limiting of the invention. The scope of the invention is not limited to just the foregoing description.

What is claimed is:

1. A longitudinal mode resonator comprising:
   a substrate; and
   a bar suspended relative to a surface of the substrate such that the bar is free to expand and contract substantially parallel to the surface of the substrate in response to an electrical field applied across a thickness of the bar, the expansion and contraction reaching resonance in response to the electrical field having a frequency substantially equal to a resonant frequency of the bar.

2. The longitudinal mode resonator of claim 1 wherein the bar comprises first and second surfaces, the longitudinal mode resonator further comprising:
   an input electrode disposed on the first surface; and
   an output electrode disposed on the second surface.

3. The longitudinal mode resonator of claim 2 further comprising an electrical signal input connection in electrical communication with the input electrode for providing an electrical signal to the input electrode.

4. The longitudinal mode resonator of claim 1 further comprising two flexural supports for suspending the bar relative to the substrate.

5. The longitudinal mode resonator of claim 4 wherein the substrate comprises a cavity and the flexural supports suspend the bar relative to the cavity in the substrate.

6. The longitudinal mode resonator of claim 1 wherein the bar comprises a piezoelectric material.

7. The longitudinal mode resonator of claim 1 wherein the bar comprises Aluminum Nitride.

8. The longitudinal mode resonator of claim 1 further comprising a support on the substrate for supporting the bar relative to the substrate.

9. The longitudinal mode resonator of claim 1 wherein the bar comprises first and second surfaces and the longitudinal mode resonator further comprises:
   an input electrode disposed on the first surface;
   an output electrode disposed on the second surface; and
   a capacitive plate positioned adjacent to the output electrode.

10. The longitudinal mode resonator of claim 1 further comprising a second substrate defining a cavity, a capacitive plate being disposed within the cavity of the second substrate, and the bar being suspended in the cavity of the second substrate and spaced apart from the capacitive plate.

11. The longitudinal mode resonator of claim 1 wherein the resonant frequency of the bar is determined by a dimension substantially parallel to the surface of the substrate.

12. A multi-frequency filter comprising:
   a substrate;
   an input terminal for receiving an alternating signal;
   a first resonator comprising a first bar having a first length suspended relative to a surface of the substrate such that the first bar is free to expand and contract substantially parallel to the surface of the substrate in response to an electrical field applied across a thickness of the first bar, the expansion and contraction reaching resonance in response to the electrical field having a frequency substantially equal to a resonant frequency of the first bar;
   a second resonator comprising a second bar having a second length suspended relative to the surface of the substrate such that the second bar is free to expand and contract substantially parallel to the surface of the substrate in response to an electrical field applied across a thickness of the second bar, the expansion and contraction reaching resonance in response to the electrical field having a frequency substantially equal to a resonant frequency of the second bar;
   a multiplexer in electrical communication with the input terminal, the first resonator, and the second resonator, the multiplexer communicating the signal to at least one of the first resonator and the second resonator; and
   an output terminal in electrical communication with the first resonator and the second resonator.

13. The multi-frequency filter of claim 12 wherein at least one of the first resonator and the second resonator further comprises two flexural supports for suspending one of the first bar and the second bar relative to the substrate.

14. The multi-frequency filter of claim 13 wherein the substrate defines a cavity and the flexural supports suspend one of the first bar and the second the bar relative to the cavity in the substrate.

15. The multi-frequency filter of claim 12 wherein at least one of the first bar and the second bar comprises first and second surfaces, the multi-frequency filter further comprising:
   an input electrode disposed on the first surface and in electrical communication with the multiplexer; and
   an output electrode disposed on the second surface.

16. The multi-frequency filter of claim 12 wherein at least one of the first bar and the second bar comprises a piezoelectric material.

17. The multi-frequency filter of claim 12 wherein at least one of the first bar and the second bar comprises Aluminum Nitride.

18. The multi-frequency filter of claim 12 wherein at least one of the first resonator and second resonator further comprises a support on the substrate for supporting at least one of the first bar and the second bar relative to the substrate.

19. The multi-frequency filter of claim 12 wherein at least one of the first bar and second bar comprises first and second surfaces and the multi-frequency filter further comprises:
   an input electrode disposed on the first surface and in electrical communication with the multiplexer;
   an output electrode disposed on the second surface; and
   a capacitive plate positioned adjacent to the output electrode.

20. The multi-frequency filter of claim 12 wherein at least one of the first resonator and the second resonator further comprises a second substrate, the second substrate defining a cavity, a capacitive plate being disposed in the cavity of the second substrate, and the bar of the at least one of the first resonator and the second resonator being suspended in the cavity of the second substrate and spaced apart from the capacitive plate.

21. A multi-frequency oscillator comprising:
   a substrate;
   a nonlinear feedback element for providing a signal;
   a first resonator comprising a first bar having a first length suspended relative to a surface of the substrate such that the first bar is free to expand and contract substantially parallel to the surface of the substrate in response to an electrical field applied across a thickness of the first bar, the expansion and contraction reaching resonance in response to the electrical field having a frequency substantially equal to a resonant frequency of the first bar;
   a second resonator comprising a second bar having a second length suspended relative to the surface of the substrate such that the second bar is free to expand and contract substantially parallel to the surface of the substrate in response to an electrical field applied across a thickness of the second bar, the expansion and contraction reaching resonance in response to the electrical field having a frequency substantially equal to resonant frequency of the second bar;
   a multiplexer in electrical communication with the nonlinear feedback element, the first resonator, and the second resonator, the multiplexer communicating the signal to at least one of the first resonator and the second resonator; and an output terminal in electrical communication with the first resonator and the second resonator.

22. The multi-frequency oscillator of claim 21 wherein at least one of the first resonator and the second resonator further comprises two flexural supports for suspending one of the first bar and the second bar the bar relative to the substrate.

23. The multi-frequency oscillator of claim 22 wherein the substrate comprises a cavity and the flexural supports suspend one of the first bar and the second the bar relative to the cavity in the substrate.

24. The multi-frequency oscillator of claim 21 wherein at least one of the first bar and the second bar comprises first and second surfaces, the multi-frequency oscillator further comprising:

an input electrode disposed on the first surface and in electrical communication with the multiplexer; and an output electrode disposed on the second surface.

25. The multi-frequency oscillator of claim 21 wherein at least one of the first bar and the second bar comprises a piezoelectric material.

26. The multi-frequency oscillator of claim 21 wherein at least one of the first bar and the second bar comprises Aluminum Nitride.

27. The multi-frequency oscillator of claim 21 wherein at least one of the first resonator and second resonator further comprises a support on the substrate for supporting at least one of the first bar and the second bar relative to the substrate.

28. The multi-frequency oscillator of claim 21 wherein at least one of the first bar and second bar comprises first and second surfaces and the multi-frequency oscillator further comprises:

an input electrode disposed on the first surface and in electrical communication with the multiplexer;

an output electrode disposed on the second surface; and a capacitive plate positioned adjacent to the output electrode.

29. The multi-frequency oscillator of claim 21 wherein at least one of the first resonator and the second resonator further comprises a second substrate, the second substrate defining a cavity, a capacitive plate being disposed in the cavity of the second substrate, and the bar of the at least one of the first resonator and the second resonator being suspended in the cavity of the second substrate and spaced apart from the capacitive plate.

30. The multi-frequency oscillator of claim 21 wherein the nonlinear feedback element is an amplifier.

* * * * *